United States Patent
Watanabe et al.

(10) Patent No.: US 9,368,713 B2
(45) Date of Patent: Jun. 14, 2016

(54) PIEZOELECTRIC FILM-ATTACHED SUBSTRATE, PIEZOELECTRIC FILM ELEMENT AND METHOD OF MANUFACTURING THE SAME

(71) Applicant: HITACHI CABLE, LTD., Tokyo (JP)

(72) Inventors: Kazutoshi Watanabe, Tokyo (JP); Kenji Shibata, Tokyo (JP); Kazufumi Suenaga, Tokyo (JP); Akira Nomoto, Tokyo (JP); Fumimasa Horikiri, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 493 days.

(21) Appl. No.: 13/796,243

(22) Filed: Mar. 12, 2013

(65) Prior Publication Data

US 2013/0249354 A1  Sep. 26, 2013

(30) Foreign Application Priority Data

Mar. 22, 2012 (JP) .................................. 2012-066425

(51) Int. Cl.
*H01L 41/18* (2006.01)
*H01L 41/29* (2013.01)
(Continued)

(52) U.S. Cl.
CPC ............. *H01L 41/18* (2013.01); *G01B 11/0625* (2013.01); *H01L 41/1873* (2013.01); *H01L 41/29* (2013.01); *H01L 41/316* (2013.01); *Y10T 29/42* (2015.01)

(58) Field of Classification Search
CPC ........ H01L 41/39; H01L 41/09; B41J 2/1623; H03H 9/19; H03H 9/02157; B06B 1/0655
USPC .................................................. 310/368, 369
See application file for complete search history.

(56) References Cited

U.S. PATENT DOCUMENTS 7,286,242 B2  10/2007  Kim et al.
7,482,736 B2   1/2009  Ueno
(Continued)

FOREIGN PATENT DOCUMENTS

JP  2000-186916   7/2000
JP  2005-503547   2/2005
(Continued)

OTHER PUBLICATIONS

English Translation of JP 2000-186916, Yoichi.*
(Continued)

*Primary Examiner* — Shawki S Ismail
*Assistant Examiner* — Bryan Gordon
(74) *Attorney, Agent, or Firm* — Paul D. Bianco; Katharine Davis; Fleit Gibbons Gutman Bongini & Bianco PL

(57) ABSTRACT

There is provided a piezoelectric film-attached substrate, including a piezoelectric film having a specific thickness, wherein a reflection spectrum shows a relation between a light obtained in such a way that the surface of the piezoelectric film is irradiated with an irradiation light having a specific wavelength and the irradiation light is reflected on the surface of the piezoelectric film, and a light obtained in such a way that the irradiation light is transmitted through the piezoelectric film and is reflected on the surface of the lower electrode, which is the reflection spectrum at least at one point on a center part and an outer peripheral part of the piezoelectric film, and such a reflection spectrum has at least one of the maximum value and the minimum value respectively, wherein the reflectance at least in one maximum value is 0.4 or more.

9 Claims, 5 Drawing Sheets

(51) Int. Cl.
*H01L 41/187* (2006.01)
*H01L 41/316* (2013.01)
*G01B 11/06* (2006.01)

(56) References Cited

U.S. PATENT DOCUMENTS

| | | | |
|---|---|---|---|
| 7,710,003 B2 | 5/2010 | Shibata et al. | |
| 8,004,163 B2 | 8/2011 | Shibata et al. | |
| 8,058,779 B2 | 11/2011 | Suenaga et al. | |
| 8,063,543 B2 | 11/2011 | Shibata | |
| 2004/0246493 A1* | 12/2004 | Kim | G01B 11/0625 356/504 |
| 2007/0126313 A1 | 6/2007 | Ueno | |
| 2008/0213575 A1* | 9/2008 | Shimizu | B41J 2/14233 428/332 |
| 2008/0308762 A1 | 12/2008 | Ueno | |
| 2009/0096328 A1 | 4/2009 | Shibata et al. | |
| 2009/0236944 A1* | 9/2009 | Shibata | H01L 41/0805 310/358 |
| 2010/0013894 A1 | 1/2010 | Ueno | |
| 2010/0141099 A1 | 6/2010 | Suenaga et al. | |
| 2010/0156247 A1 | 6/2010 | Shibata et al. | |
| 2010/0242242 A1* | 9/2010 | Shimizu | H01L 41/094 29/25.35 |
| 2012/0025668 A1 | 2/2012 | Suenaga et al. | |

FOREIGN PATENT DOCUMENTS

| | | |
|---|---|---|
| JP | 2006-173377 | 6/2006 |
| JP | 2007-184513 | 7/2007 |
| JP | 2008-159807 | 7/2008 |
| JP | 2009-117785 | 5/2009 |
| JP | 2010-161330 | 7/2010 |

OTHER PUBLICATIONS

English Translation of JP 2000-186916, Yoichi, 2000.*
Office Action with drafting date of Mar. 13, 2015 for Japanese Application No. 2012-066425.

* cited by examiner

PIEZOELECTRIC FILM-ATTACHED SUBSTRATE, PIEZOELECTRIC FILM ELEMENT AND METHOD OF MANUFACTURING THE SAME

The present application is based on Japanese Patent Application No. 2012-066425 filed on Mar. 22, 2012, the entire contents of which are hereby incorporated by reference.

TECHNICAL FIELD

The present invention relates to a piezoelectric film-attached substrate, a piezoelectric film element and a method of manufacturing the same.

DESCRIPTION OF RELATED ART

A piezoelectric film is processed into various piezoelectric film elements for various purposes of use, and is widely utilized as functional electronic components such as an actuator for generating deformation under application of voltage and a sensor for generating voltage from the deformation of an element reversely. A dielectric material made of lead-based materials having excellent piezoelectric properties, and particularly $Pb(Zr_{1-x}Ti_x)O_3$-based perovskite ferroelectrics called PZT, are widely used as the piezoelectric film utilized for the purpose of use of the actuator and sensor. Usually, the piezoelectric film such as PZT is formed by sintering an oxide composed of individual elements. At present, miniaturization and higher performance are strongly requested for the piezoelectric film element, with a progress of the miniaturization and higher performance of each kind of electronic components.

However, there is a problem in a piezoelectric material fabricated by a producing method focusing on a sintering method being a conventional fabricating method, as follows. As the piezoelectric material is made thinner and particularly as its thickness becomes close to about 10 µm, a size of the piezoelectric material becomes close to a size of crystal grains constituting the material, and an influence thereof cannot be ignored, thus posing a problem that variation and deterioration of the characteristic are great. In order to avoid the aforementioned problem, a method of forming the piezoelectric film applying a thin film technique instead of the sintering method, has been studied in recent years. In recent years, a PZT thin film formed on a silicon substrate by sputtering, is put to practical use as the piezoelectric film for an actuator for a high-speed and high-definition inkjet printer head.

Meanwhile, a piezoelectric sintered compact and a piezoelectric thin film made of PZT contains lead by about 60 to 70 wt %, and therefore are not preferable from an aspect of an ecological standpoint and pollution control. Therefore, it is desired to develop a piezoelectric film not containing lead in consideration of an environment. At present, various lead-free piezoelectric materials are studied, and above all, potassium sodium niobate (described as "KNN" hereafter) represented by a composition formula: $(K_{1-x}Na_x)NbO_3$ $(0<x<1)$ can be given as an example (for example, see patent document 1 and patent document 2). Such potassium sodium niobate includes a material having a perovskite structure, and is expected as a strong candidate of the lead-free piezoelectric material. The KNN thin film is also attempted to be formed on a substrate such as MgO substrate, $SrTiO_3$ substrate, and Si substrate, etc., by a film formation method such as a sputtering method, etc.

Patent document 1:
Japanese Patent Laid Open Publication No. 2007-184513
Patent document 2:
Japanese Patent Laid Open Publication No. 2008-159807

Incidentally, the piezoelectric film is processed into the piezoelectric film element, wherein the piezoelectric film formed as a thin film by the sputtering method, etc., is processed into a minute device in many cases, compared with a piezoelectric material formed by a conventional sintering method. Processing is performed by a method of manufacturing a semiconductor element, including a photolithography step and an etching step of shaving a material into a fine shape using a chemical solution or gas. Therefore, there is a necessity for finely controlling a shaving amount of the piezoelectric film when processing it into the piezoelectric film element. Accordingly, information regarding a film thickness of the piezoelectric film is important. Further, a deformation amount of the piezoelectric film under voltage application is varied depending on the film thickness. Therefore, the film thickness is important in terms of knowing the characteristic of a device. Accordingly, the film thickness of the piezoelectric film is measured after film formation.

Regarding this point, there are following two kinds of methods for example, as a method of measuring the film thickness of the piezoelectric film.

One of the methods is a contact system for example, which is a method of cutting the formed piezoelectric film and actually measuring its cross-sectional face, or providing a surface with a film not previously formed thereon, and measuring a level difference thereof using a probe, to thereby measure the film thickness. However, the contact system involves a problem such as a destruction or contamination, etc., of the piezoelectric film, because the film thickness is measured with the probe, etc., in contact with the piezoelectric film.

The other method is an optical measurement method of irradiating a surface of the piezoelectric film with a light and measuring a phase difference of the reflected light, to thereby measure the film thickness. According to the optical measurement method, the film thickness can be measured by the light in a non-contact state, and therefore the film thickness can be measured in a non-destruction state.

However, in the above-mentioned optical measurement method, there is a difference between a measured value of the film thickness and an actual film thickness, thus making it difficult to accurately measure the film thickness. Namely, when a film is formed having a specific film thickness, there is sometimes a case that the film thickness is judged by measurement to be a non-standard thickness, irrespective of the piezoelectric film having a normal film thickness actually. Therefore, a film thickness value of the piezoelectric film obtained by the optical measurement method is not highly reliable.

In view of the above-described problem, the present invention is provided, and an object of the present invention is to provide a piezoelectric film-attached substrate having a high reliability in a film thickness value of the piezoelectric film, and a piezoelectric film element using the same, and a method of manufacturing the same.

SUMMARY OF THE INVENTION

According to a first aspect of the present invention, there is provided a piezoelectric film-attached substrate, including a lower electrode formed on a main surface, and a piezoelectric film having a perovskite structure formed on the lower electrode, which are sequentially laminated, wherein the piezoelectric film has a thickness of 0.3 μm or more and 10 μm or less, and a reflection spectrum shows a relation between a wavelength and a reflectance calculated from a reflected light obtained by an interference of following lights: a light which is obtained in such a way that the surface of the piezoelectric film is irradiated with an irradiation light with a wavelength range of 400 nm to 800 nm and the irradiation light is reflected on the surface of the piezoelectric film, and a light which is obtained in such a way that the irradiation light is transmitted through the piezoelectric film and reflected on the surface of the lower electrode, which is the reflection spectrum at least at one point on a center part and an outer peripheral part of the piezoelectric film, and such a reflection spectrum has at least one of the maximum value and the minimum value respectively, wherein the reflectance at least in one maximum value is 0.4 or more.

DETAILED DESCRIPTION OF THE INVENTION

As described above, according to an optical measurement method, a film thickness value of a piezoelectric film can be measured in a non-destruction state. In the optical measurement method, a piezoelectric film is irradiated with a light, and a reflection spectrum is obtained from the reflected light which is obtained by irradiating the piezoelectric film with lights and by an interference of the reflected lights, and a film thickness value is calculated based on the obtained reflection spectrum. However, in the optical measurement method, there is a difference between a measured value and an actual measured value in some cases, and the film thickness value cannot be measured accurately, thus involving a problem that reliability of the measured value of the film thickness is low. Probably, such a problem is generated because a measurement surface of the piezoelectric film irradiated with the light and a light receiving surface for receiving the reflected light are not parallel with each other due to a warpage of the formed piezoelectric film, and the reflected light obtained by the interference cannot be measured accurately. Also, such a problem is generated because an irradiation light is scattered on the surface of the piezoelectric film by a surface roughness of the formed piezoelectric film, and the reflected light cannot be accurately measured. Namely, conventionally, a film thickness value of the film thickness is measured based on a reflection spectrum obtained on the assumption that the reflected light cannot be accurately measured due to a variation in the reflection. Therefore, the reflection spectrum obtained by an optical film thickness measurement is focused by inventors of the present invention, and it is found that accuracy of the measurement of the film thickness can be judged by a waveform of the reflection spectrum. Thus, the present invention is achieved.

Figure 1:
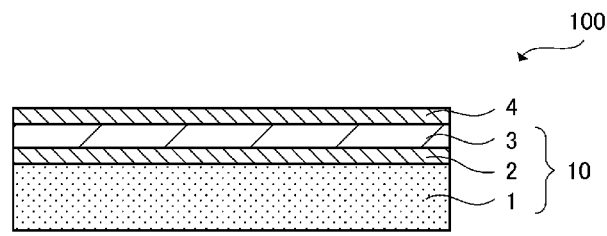
FIG. 1 is a view showing a cross-sectional face of a piezoelectric film element according to an embodiment of the present invention.

A piezoelectric film-attached substrate, a piezoelectric film element, and a method of producing the same according to an embodiment of the present invention, will be described hereafter. After description of the method of producing a piezoelectric film element, a structure of the piezoelectric film-attached substrate, and the piezoelectric film element, will be described hereafter. FIG. 1 shows a cross-sectional view of the piezoelectric film element according to an embodiment of the present invention.

[A Method of Producing a Piezoelectric Film Element]

A method of producing a piezoelectric film element 100 of an embodiment of the present invention includes:

forming a lower electrode 2 on a substrate 1;

forming a piezoelectric film 3 having a perovskite structure on the lower electrode 2;

irradiating a surface 3a of the piezoelectric film formed on the lower electrode 2 with an irradiation light with a wavelength range of 400 nm to 800 nm, before the upper electrode 4 is formed;

receiving a reflected light obtained by an interference of following lights: a light which is obtained in such a way that the irradiation light is reflected on the surface 3a of the piezoelectric film, and a light which is obtained in such a way that the irradiation light is transmitted through the piezoelectric film 3 and is reflected on a surface 2a of the lower electrode;

obtaining a reflection spectrum showing a relation between a wavelength and a reflectance calculated from the reflected light, and judging so that the reflection spectrum obtained at least at one point of a center part and an outer peripheral part of the piezoelectric film 3 respectively has at least one of the maximum values and the minimum values, and a reflectance at least in one maximum value is 0.4 or more.

First, the lower electrode 2 is formed on a main surface of the substrate 1 by a sputtering method.

A Si (silicon) substrate, an oxide film-attached Si substrate, or an SOI (Silicon On Insulator) substrate is preferably used as the substrate 1. For example, (100) Si substrate with a surface of the Si substrate having (100) plane orientation is used as the Si substrate. However, the Si substrate having a plane orientation different from the (100) plane orientation may also be used. Further, a quartz glass substrate, a GaAs substrate, a sapphire substrate, a metal substrate such as stainless, a MgO substrate, and a SrTiO$_3$ substrate, etc., may also be used as the substrate 1, other than the Si substrate.

A thermal oxide film formed by thermal oxidation or a Si oxide film formed by a CVD (Chemical Vapor Deposition) method, etc., can be given as an oxide film in the oxide film-attached Si substrate. In a case of an oxide substrate such as MgO, SrTiO$_3$, SrRuO$_3$, and quartz glass, the lower electrode 2 may be directly formed on the substrate 1 without forming the oxide film.

Figure 12:
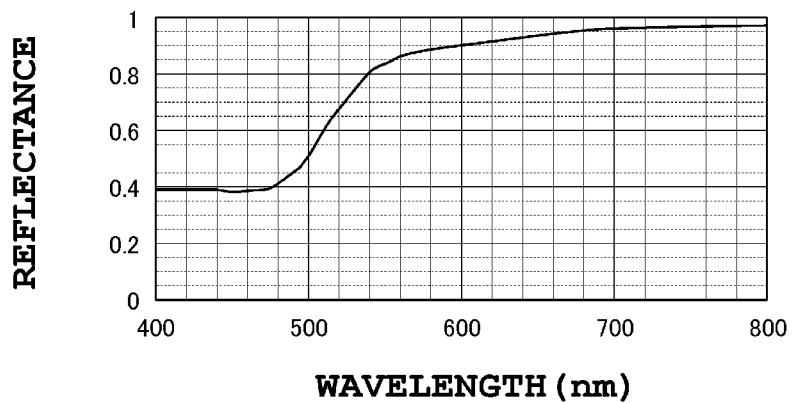
FIG. 12 is a reflection spectrum obtained when measuring a center part of a Pt film of example 1 of the present invention.
Figure 13:
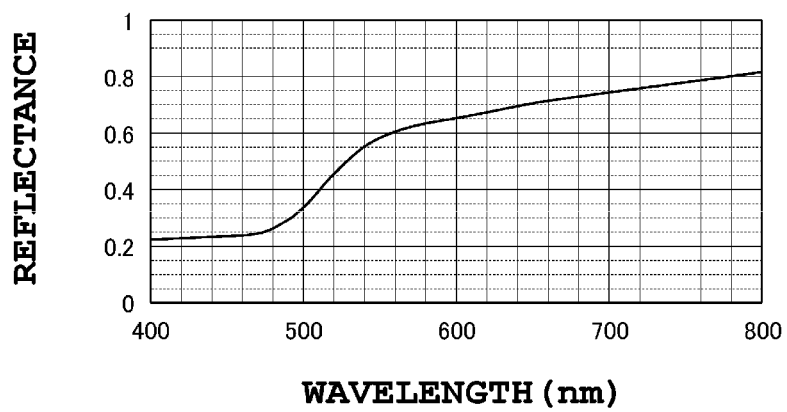
FIG. 13 is a reflection spectrum obtained when measuring a center part of a Pt film of comparative example 3 of the present invention.

The lower electrode 2 is a ground layer for forming the piezoelectric film 3 thereon, and has a structure of a coexistence of at least one of the (001) preferential orientation crystal, (110) preferential orientation crystal, and (111) preferential orientation crystal. The lower electrode 2 has a structure including Pt, Ru, Ir, Sn, In, or is mainly composed of an oxide of them, or has a lamination structure including these electrode layers. Further, as the lower electrode 2, when its surface is irradiated with the irradiation light with a wavelength range of 400 nm to 800 nm, the reflectance is preferably 0.7 or more in a half or more region of the wavelength range of 400 nm to 800 nm. FIG. 12 shows the reflection spectrum when the reflectance in a half or more region of the wavelength range of 400 nm to 800 nm is 0.7 or more (example 1 as will be described later), and FIG. 13 shows the reflection spectrum when the reflectance in a half or more region of the wavelength range of 400 nm to 800 nm is not 0.7 or more (comparative example 3 as will be described later), respectively on the surface of the lower electrode. When the reflection spectra shown in FIG. 12 and FIG. 13 are compared, the reflection spectrum shown in FIG. 13 shows that the region where the reflectance is 0.7 or more occupies less than half in a prescribed wavelength range, and the surface of the lower electrode is roughened. In this case, lights transmitted through the piezoelectric film 3 and reflected by the surface 2a of the lower electrode are scattered, and reliability of the measured value of the film thickness is lowered. Further, surface roughness of the piezoelectric film 3 formed on the lower electrode 2 is probably deteriorated. In order to increase adhesion properties between the substrate 1 and the lower electrode 2, an adhesive layer may be provided between the substrate 1 and the lower electrode 2. A Ti layer, etc., may be used as the adhesive layer.

Next, the piezoelectric film 3 having the perovskite structure is formed on the lower electrode 2, to thereby obtain a piezoelectric film-attached substrate 10. Film formation of the piezoelectric film 3 is performed using a (K$_{1-x}$Na$_x$)NbO$_3$ sintered compact as a target for example, under conditions of setting a substrate temperature (temperature on the surface of the substrate) at 100° C. or more and 900° C. or less, using a gas such as Ar as an introducing gas, and setting a pressure of the introducing gas atmosphere at 0.02 Pa or more and 5 Pa or less.

The piezoelectric film 3 has the perovskite structure, and has a crystal structure of a pseudo-cubic crystal system, a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist. Preferably, the piezoelectric film 3 contains potassium sodium niobate (described as "KNN" hereafter) expressed by a general formula: (K$_{1-x}$Na$_x$)NbO$_3$ (0<x<1), and a composition x=Na/(K+Na) ratio is preferably in a range of 0.40≤x≤0.70. Further, the KNN piezoelectric film may also contain Li, Ta, Sb, Ca, Cu, Ba, and Ti, etc., with an amount of 5% or less, as other elements.

Next, the film thickness of the piezoelectric film 3 formed in the above-mentioned step is measured, and whether the film thickness value is highly reliable, is judged. In this embodiment, following steps are performed: irradiating the surface 3a of the piezoelectric film formed on the lower electrode 2 with an irradiation light with a wavelength range of 400 nm to 800 nm; receiving a reflected light obtained by an interference of following lights: a light which is obtained in such way that the irradiation light is reflected on the surface 3a of the piezoelectric film, and a light which is obtained in such a way that the irradiation light is transmitted through the piezoelectric film 3 and is reflected on the surface 2a of the lower electrode; obtaining a reflection spectrum showing a relation between a wavelength and a reflectance calculated from the reflected light; and judging that the reflection spectrum obtained at least at one point of a center part and an outer peripheral part of the piezoelectric film 3 respectively, has at least one maximum value and one minimum value respectively, and the reflectance at least in one maximum value is 0.4 or more.

Figure 2:
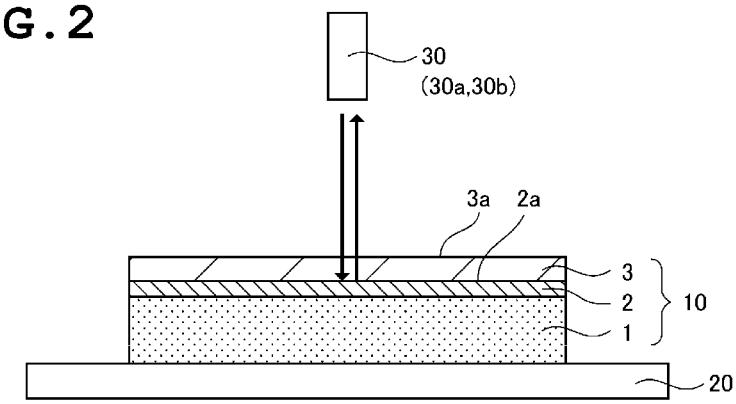
FIG. 2 is a view describing a method of measuring a film thickness of a piezoelectric film.
Figure 3:
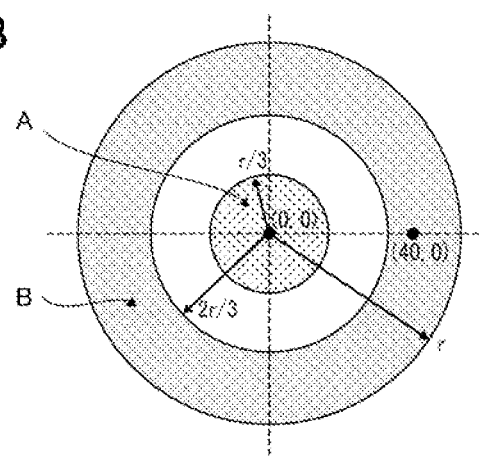
FIG. 3 is a view describing measurement points on a surface of the piezoelectric film.

Specifically, as shown in FIG. 2, the piezoelectric film-attached substrate 10 obtained as described above, is placed on a flat stage 20, and a measurement head 30 having a light source 30a and a light receiving part 30b is disposed at an arbitrary position on the surface 3a of the piezoelectric film, and the piezoelectric film is irradiated with the irradiation light with a wavelength of 400 nm to 800 nm from the light source 30a. At least one point of the center part and the outer peripheral part of the piezoelectric film 3 is selected as a position to be irradiated with the irradiation light. For example, the center part indicates an area inside of r/3 and the outer peripheral part indicates an area outside of 2r/3, on the substrate having a radius r. Namely, as shown in FIG. 3, the center part indicates an area (area A in the figure) of a prescribed distance from a center point (0,0) of the piezoelectric film, and the outer peripheral part indicates an area (area B in the figure) in a more outer peripheral direction than the center part. By selecting one point of the center part and the outer peripheral part respectively, a difference in measurement conditions on the surface of the piezoelectric film, for example, a difference in measurement conditions caused by a warpage of the substrate, can be recognized.

The irradiation light from the light source 30a is reflected by the surface 3a of the piezoelectric film, and is transmitted through the piezoelectric film 3, and is reflected by the surface 2a of the lower electrode. The light reflected by the surface 2a of the lower electrode has a deviated phase, and interferes with the light reflected by the surface 3a of the piezoelectric film, so that the lights are strengthened or weakened each other. The reflected light obtained by the interference of the lights reflected by the piezoelectric film 3 and the lower electrode 2, is received by the light receiving part 30b. The received reflected light is diffracted, and a ratio (reflectance) is calculated from an intensity of an incident light and an intensity of the reflected light, to thereby obtain the reflection spectrum showing a relation between the reflectance and the wavelength.

The obtained reflection spectrum shows a prescribed waveform in the wavelength range of 400 nm to 800 nm of the irradiation light.

Figure 4:
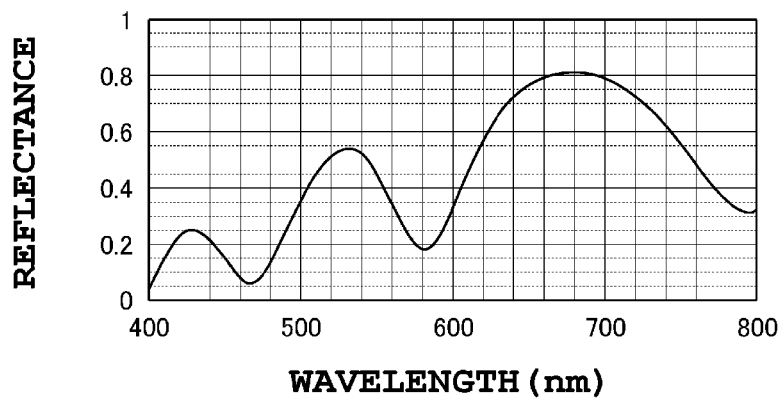
FIG. 4 is a reflection spectrum obtained when measuring a center part of the piezoelectric film of example 1 of the present invention.

Here, the reflection spectrum showing the relation between the reflectance and the wavelength, and a method of calculating the film thickness from the reflection spectrum, will be described using FIG. 4. FIG. 4 shows an example (example 1 as will be described later) of measuring the reflection spectrum. In FIG. 4, the reflection spectrum shows a periodic waveform having a plurality of peaks, and the waveform has a plurality of maximum values and minimum values. When the surface of the piezoelectric film 3 on the substrate 1 is irradiated with lights vertically, two reflected lights from the surface 3a of the piezoelectric film and a lower surface (the surface 2a of the lower electrode 2), are strengthened or weakened each other depending on a mutual phase relation. The phase relation is determined by a film thickness (d) of the piezoelectric film, an optical constant (n: refractive index of the piezoelectric film), and a wavelength ($\lambda$). When $2nd=i\lambda$ (i: integer) is established, the lights are strengthened each other, and the waveform has the maximum value. Meanwhile, when $2nd=(i+1/2)\lambda$ is established, the lights are weakened each other, and the waveform has the minimum value.

For example, when the piezoelectric film 3 is vertically irradiated with the irradiation light, the reflectance R is expressed by $R \approx A+B \cos(2\pi/\lambda \cdot nd)$. Parameter-fitting is performed, so as to match the actually measured reflection spectrum, to thereby obtain constants A, B, d respectively. A solution in which the deviation is smallest in the wavelengths of the maximum value and the minimum value of the reflectance, is selected as the finally obtained solution.

In the reflection spectrum, a larger amplitude and a more sudden variation in the vicinity of an extreme value, indicates a higher accuracy of fitting, namely, a higher measurement accuracy. Further, a great largest value of the maximum values shows that the amplitude of the reflection spectrum becomes large in this range, and reversely a small largest value of the maximum values shows that the amplitude becomes small in this range or the smaller range (smaller than 0.4, when the maximum value is 0.4 or less). Namely, the reflection spectrum having the reflectance at the maximum value close to 1 as much as possible, and having a plurality of points in which the reflectance is 0.4 or more, indicates a higher accuracy of measurement, and indicates a higher reliability of the calculated film thickness value. Meanwhile, even in a case of the reflection spectrum in which the reflectance at the maximum value is less than 0.4, the film thickness value can be calculated. However, light reception of the reflected light is not sufficiently performed, and therefore accuracy of the measurement is low, and the reliability in the calculated film thickness value is low.

Accordingly, for example, when the reflection spectrum as shown in FIG. 4 is obtained, it can be so judged that an accurate measurement is performed by the optical system.

Figure 7:
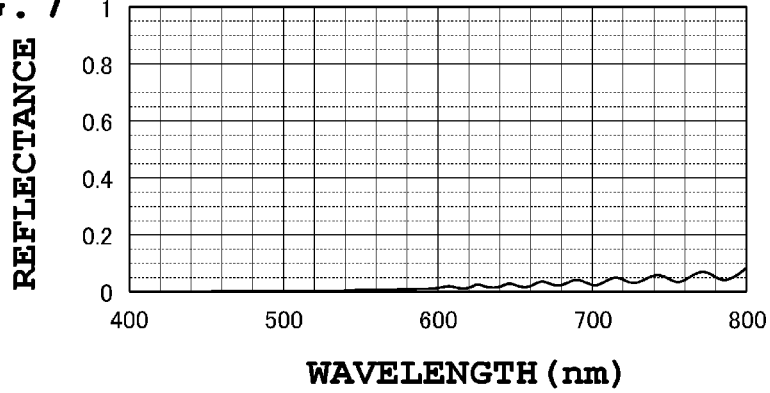
FIG. 7 is a reflection spectrum obtained when measuring a center part of a piezoelectric film of comparative example 1 of the present invention.
Figure 9:
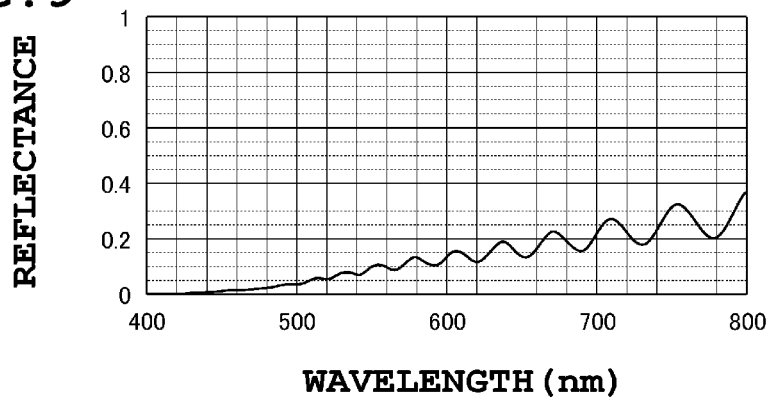
FIG. 9 is a reflection spectrum obtained when measuring an outer peripheral part of the piezoelectric film of comparative example 2 of the present invention.

Meanwhile, the reflection spectrum when the measurement of the film thickness by the optical system is not accurately performed due to a state of the piezoelectric film 3, shows the waveform as shown in FIG. 7 or FIG. 9 for example. FIG. 7 shows the reflection spectrum when the reflected light cannot be accurately received, because the surface roughness of the piezoelectric film is large (comparative example 1 as will be described later). FIG. 9 shows the reflection spectrum when the reflected light cannot be accurately received, because the warpage of the piezoelectric film is large (comparative example 2 as will be described later).

FIG. 7 shows the reflection spectrum when the surface roughness (arithmetic average roughness Ra) of the piezoelectric film 3 exceeds 20 nm. In the piezoelectric film 3 with a large surface roughness, scattering of the irradiation light occurs on the surface 3a of the piezoelectric film. Then, the reflectance of the reflected light is reduced by such a scattering, thus making it impossible to sufficiently receive the reflected light on the light receiving part 30b, and the reflection spectrum as shown in FIG. 7 is obtained. In FIG. 7, there is no point where the reflectance at the maximum value is 0.4 or more, and it is found that the reflectance is extremely small in an overall wavelength region.

Further, FIG. 9 shows the reflection spectrum when a warpage amount of the piezoelectric film exceeds 60 $\mu$m. In the piezoelectric film-attached substrate 10 having a large warpage amount, a measurement surface of the light source 30a and a light receiving surface of the light receiving part 30b are in a state largely deviated from a parallel state. In this state, a prescribed angle is applied to the reflected light, thus reducing the reflectance of the reflected light, and the reflected light cannot be sufficiently received on the light receiving part 30b, and the reflection spectrum as shown in FIG. 9 is obtained. In FIG. 9, there is no point where the reflectance at the maximum value is 0.4 or more, and it is found that the reflectance is extremely small in the overall wavelength region. The warpage amount of the substrate corresponds to a difference of heights between a center position of the piezoelectric film, and a position of a prescribed distance from the center position of the piezoelectric film.

Then, it is so judged that the reflection spectrum obtained at least at one point on the center part and the outer peripheral part of the piezoelectric film 3, has at least one maximum value and one minimum value respectively, and the reflectance at least at one maximum value is 0.4 or more. When the reflected light which is reflected and interferes with the other light, is not sufficiently received by the light receiving part 30b due to the surface roughness of the piezoelectric film 3 and the warpage of the substrate 1, the reflection spectrum obtained at each point on the center part and the outer peripheral part, does not show a prescribed waveform, and therefore it is found that the accuracy of the measurement is extremely low. Accordingly, in this embodiment, the reliability of the calculated film thickness value of the piezoelectric film 3 can be judged by the obtained waveform of the reflection spectrum. Namely, the accuracy of the measurement is judged by the reflection spectrum, and the film thickness value of the piezoelectric film with high reliability can be obtained.

Subsequently, an upper electrode 4 is formed on the obtained piezoelectric film 3 by sputtering, to thereby obtain the piezoelectric film element 100 of this embodiment. The upper electrode 4 does not have a large influence on the crystal structure of the piezoelectric film 3 like the lower electrode 2, and therefore a material of the upper electrode 4 is not particularly limited. The upper electrode 4 may have the structure including Pt, Ru, Ir, Sn, In, or may be mainly composed of the oxide of them, or may have a lamination structure including these electrode layers, similarly to the lower electrode 2.

[A Piezoelectric Film-Attached Substrate and a Piezoelectric Film Element]

The piezoelectric film-attached substrate 10 according to an embodiment of the present invention has a structure in which the lower electrode 2 formed on the main surface and the piezoelectric film 3 having a perovskite structure formed on the lower electrode 2, are sequentially laminated, wherein the piezoelectric film 3 has a thickness of 0.3 $\mu$m or more and 10 $\mu$m or less, and the reflection spectrum shows the relation between the wavelength and the reflectance calculated from the reflected light obtained by the interference of the following lights: the light which is obtained in such a way that the surface of the piezoelectric film is irradiated with an irradiation light with a wavelength range of 400 nm to 800 nm and the irradiation light is reflected on the surface of the piezoelectric film, and the light which is obtained in such a way that the irradiation light is transmitted through the piezoelectric film and is reflected on the surface of the lower electrode, which is the reflection spectrum at least at one point on the center part and the outer peripheral part of the piezoelectric film 3, and such a reflection spectrum has at least one of the maximum values and one of the minimum values respectively, wherein the reflectance at least at one maximum value is 0.4 or more.

Further, the piezoelectric film 100 according to an embodiment of the present invention, includes the piezoelectric film-attached substrate 10 and the upper electrode 4 formed on the piezoelectric film 3.

In the piezoelectric film 3 of the piezoelectric film-attached substrate 10 and the piezoelectric film element 100, the reflection spectrum obtained on the center part and the outer peripheral part shows a prescribed waveform, so that the reflected light is sufficiently received. Therefore, the piezoelectric film 3 has an advantage such as high reliability of the measured film thickness value, with small surface roughness and warpage.

In the piezoelectric film-attached substrate 10 and the piezoelectric film element 100, the thickness of the piezoelectric film 3 is 0.3 μm or more and 10 μm or less. In a case of less than 0.3 μm, the film thickness is not more than a wavelength of the irradiation light, thus not generating the interference, and not generating the extreme value of the obtained reflection spectrum, and therefore it is difficult to measure the film thickness. Meanwhile, in a case of exceeding 10 μm, reflection from the lower surface of the film becomes extremely small, due to absorption of the light into the piezoelectric film 3, and therefore it is difficult to measure the film thickness. Further, the surface roughness (arithmetic average roughness Ra) of the piezoelectric film 3 is 20 nm or less, and the warpage amount is 60 μm or less.

Effect of this Embodiment

According to this embodiment, following one or a plurality of effects can be exhibited.

In this embodiment, the reflection spectrum obtained on the center part and the outer peripheral part of the piezoelectric film, shows a prescribed waveform. According to this structure, it is so judged that the reflectance of the reflected light that interferes with the reflected light, is high and the accuracy of the measurement is also high. Thus, the reliability of the film thickness value of the piezoelectric film is high. Further, since the reflection spectrum shows a prescribed waveform, the surface roughness of the piezoelectric film and the warpage of the piezoelectric film-attached substrate are small. In addition, since measurement is performed by lights in a non-contact state, a high quality piezoelectric film can be obtained without breakage and contamination (scratch and stain).

Further, according to this embodiment, there is provided the step of judging the accuracy of the measurement from the reflection spectrum obtained in the producing step. According to this structure, the piezoelectric film having a large surface roughness and the substrate having a large warpage can be judged, simultaneously with accurate measurement of the film thickness value.

Further, in this embodiment, preferably the lower electrode has the reflectance of 0.7 or more in a half or more region of the wavelength range of 400 nm to 800 nm, when the surface of the lower electrode is irradiated with the irradiation light with the wavelength range of 400 nm to 800 nm. According to this structure, the accuracy of the film thickness measurement of the piezoelectric film can be improved and the reliability of the film thickness value can be increased, by suppressing the scattering of the light transmitted through the piezoelectric film and reflected by the surface of the lower electrode, and by improving the reflectance of the reflected light.

Further, in this embodiment, the surface roughness (arithmetic average roughness Ra) of the piezoelectric film is 20 nm or less, and the warpage amount is 60 μm or less.

EXAMPLES

The piezoelectric film-attached substrate of the present invention was produced under following method and conditions. Examples of the piezoelectric-attached substrate of the present invention are shown here, and the present invention is not limited by these examples.

Example 1

A thermal-oxide film-attached Si substrate with both sides mirror (thickness: 0.525 mm, diameter: 100 mm, (100) plane orientation, thickness of a thermal oxide film: 200 nm) was used for the substrate. First, a Ti adhesive layer (film thickness: 2 nm) and a Pt lower electrode ((111) plane preferential orientation, film thickness: 200 nm) was formed on the substrate by RF magnetron sputtering. The Ti adhesive layer and the Pt lower electrode were formed under the conditions of substrate temperature: 200° C., discharge power: 200 W, introduced gas Ar atmosphere, pressure: 2.5 Pa, and film formation time: 1 to 3 minutes. 0.5 μm of a $(K_{1-x}Na_x)NbO_3$ thin film was formed thereon by RF magnetron sputtering. The $(K_{1-x}Na_x)NbO_3$ piezoelectric film was formed under the conditions of substrate temperature: 500° C., discharge power: 2000 W, introduced gas Ar atmosphere, and pressure: 0.3 Pa, using $(K_{1-x}Na_x)NbO_3$ target satisfying Na/(K+Na)=0.65. A sputter film formation time of the KNN piezoelectric film was adjusted so that the film thickness of the piezoelectric film was approximately 0.5 μm, to thereby produce the piezoelectric film-attached substrate. Producing conditions of example 1 is shown in table 1.

TABLE 1

|  |  | Ex. 1 | Ex. 2 | Ex. 3 | Ex. 4 |
|---|---|---|---|---|---|
| Lower electrode (Pt) | Film forming temperature [° C.] | 200 | 200 | 100 | 300 |
| KNN piezoelectric film | Film forming temperature [° C.] | 500 | 500 | 500 | 500 |
|  | Film forming pressure [Pa] | 0.3 | 0.3 | 0.3 | 0.3 |
|  | Target film thickness [μm] | 0.5 | 3 | 3 | 3 |

Ex. = Example

Subsequently, regarding the obtained piezoelectric film-attached substrate of example 1, the film thickness value was calculated by optical film thickness measurement. The measurement method will be described hereafter.

(Optical Film Thickness Measurement)

In the measurement of the film thickness, an optical non-contact film thickness measurement was performed using a thin film measurement device (F20 produced by Filmetrics, Inc.). As shown in FIG. 3, two points of a center point (0,0) in the center part on the surface of the piezoelectric film having radius r (50 mm), and an outer peripheral point (0,40) positioned at 40 mm from the center part, were selected.

The center point (0,0) on the surface of the piezoelectric film of example 1 was irradiated with the irradiation light with a wavelength of 400 nm to 800 nm, to thereby obtain the waveform of the reflection spectrum as shown in FIG. 4.

According to the reflection spectrum of FIG. 4, it was confirmed that there was at least one maximum value and one minimum value respectively, and there were two maximum values in which the reflectance was 0.4 or more, and a largest reflectance in the maximum values was 0.81. The film thickness value at the center point of the piezoelectric film of example 1 was calculated by curve fitting, from the waveform of the reflection spectrum. A measured value of the film thickness at the center point was 0.53 µm.

Figure 5:
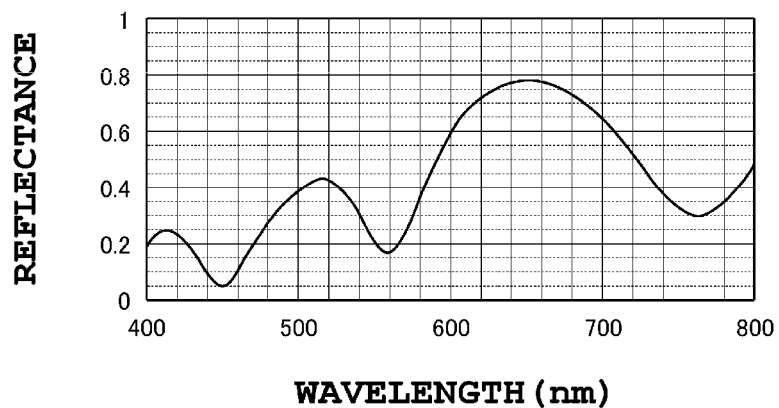
FIG. 5 is a reflection spectrum obtained when measuring an outer peripheral part of the piezoelectric film of example 1 of the present invention.

Also, similarly, the outer peripheral point (0,40) on the surface of the piezoelectric film was irradiated with a light with a prescribed wavelength range, to thereby obtain the waveform of the reflection spectrum as shown in FIG. 5. According to the reflection spectrum of FIG. 5, it was confirmed that there was at least one maximum value and one minimum value respectively, and there were two maximum values in which the reflectance was 0.4 or more, and a largest reflectance in the maximum values was 0.78. When the film thickness value on the outer peripheral part was calculated, the measured value of the film thickness was 0.51 µm.

According to FIG. 4 and FIG. 5, it was confirmed that both the obtained reflection spectra showed a prescribed waveform, and a measurement error was small between the film thickness value of the piezoelectric film and an expected film thickness value for production. Therefore, it can be considered that the film thickness value calculated by the optical film thickness measurement is highly reliable. This point was compared with the measured value obtained by the optical film thickness measurement, by measuring an accurate film thickness value by the measurement of the film thickness using SEM, to thereby substantiate a high reliability of the film thickness value. Further, the surface roughness and the warpage of the piezoelectric film were measure, and it was also confirmed that an influence of the difference in the measurement conditions is small on the center point and the outer peripheral point of the piezoelectric film. Each measurement method will be descried hereafter.

(Film Thickness Measurement Using SEM)

In order to evaluate the reliability of the measured value of the film thickness by an optical system, the film thickness being obtained from the reflection spectrum, a cross-sectional surface of the piezoelectric film was measured (measurement condition: 10000 magnifications, 5 kV), using a scanning electron microscope (SEM), to thereby obtain an accurate film thickness value, which was then compared with the measured value obtained by the above-mentioned optical system. As a result of the SEM measurement of the piezoelectric film of example 1, it was confirmed that both measured values on the center point and the outer peripheral point showed 0.5 µm, and the measurement error was small between the measured value 0.53 µm on the center point, the measured value 0.51 µm on the outer peripheral point measured from the reflection spectrum of the piezoelectric film of the present invention, and the measured value by the film thickness measurement using SEM, and measurement results substantially coincided with each other. In this example, it is so judged that there is the reliability in the measured value of the film thickness by the optical system, provided that the measured value by the optical system is within a range of less than ±10% of the measured value of the film thickness using SEM, on both the center point and the outer peripheral point.

(Measurement of the Surface Roughness)

In the measurement of the surface roughness, roughness on the surface of the piezoelectric film was examined using an atomic force microscopy (AFM). In the measurement, a range of 1 µm×1 µm was scanned at a pitch of 4 nm, to thereby analyze the surface roughness. Arithmetic average roughness Ra was measured as the surface roughness shown here. A definition equation specified in a large sample SPM observation system operation guide (1996) issued by TOYO Corporation, was used as the calculation method.

When the surface roughness of the piezoelectric film of example 1 was measured, it was confirmed that the arithmetic average roughness Ra was 2.8 nm, and the scattering of the light on the surface of the piezoelectric film was small because the reflectance of the reflection spectrum was high.

(Warpage of the Substrate)

In the measurement of the warpage, the difference between surfaces on the center point of the piezoelectric film and the outer peripheral point of the piezoelectric film, was measured.

When the warpage of the piezoelectric film substrate of example 1 was measured, it was confirmed that the surface of the piezoelectric film was relatively flat, and was in a state that the reflected light was straightly reflected and was sufficiently detected, because the warpage of the substrate was 12 µm and the reflectance of the reflection spectrum was high. Evaluation results of the piezoelectric film are shown in table 2.

Also, when the reflectance of the reflected light with the wavelength range of 400 nm to 800 nm was measured in the lower electrode of the piezoelectric film-attached substrate of example 1, the reflection spectrum as shown in FIG. 12 was obtained. According to FIG. 12, it was confirmed that the reflectance was 0.7 or more in a half or more of the wavelength range of 400 nm to 800 nm.

TABLE 2

|  |  |  | Ex. 1 | Ex. 2 | Ex. 3 | Ex. 4 |
|---|---|---|---|---|---|---|
| Reflection spectrum | Center point | A | 2 | 9 | 12 | 6 |
|  |  | B | 0.81 | 0.70 | 0.81 | 0.50 |
|  | Outer peripheral point | C | 2 | 6 | 12 | 4 |
|  |  | D | 0.78 | 0.56 | 0.77 | 0.46 |
| G [µm] |  | E | 0.53 | 2.95 | 2.94 | 2.98 |
|  |  | F | 0.5 | 3.0 | 3.0 | 3.0 |
| H [µm] |  | E | 0.51 | 2.84 | 2.83 | 2.86 |
|  |  | F | 0.5 | 2.9 | 2.9 | 2.9 |
| Ra[nm] |  | I | 2.8 | 4.1 | 4 | 5.1 |
| J [µm] |  |  | 12 | 35 | 25 | 30 |

Ex. = Example
A = Number of maximum values (reflectance: 0.4 or more)
B = Largest value of the reflectance in the maximum values
C = Number of maximum values (reflectance: 0.4 or more)
D = Largest value of the reflectance in the maximum values
E = Measured value in non-contact state
F = Measured value by SEM
G = Film thickness at the center point
H = Film thickness at the outer peripheral point
I = Arithmetic surface average roughness
J = Warpage of substrate Examples 2 to 4

In examples 2 to 4, as shown in table 1, the piezoelectric film was produced so as to obtain a thickness of 3 µm under changed film forming conditions of the piezoelectric film (film forming temperature of the lower electrode, film forming temperature of the KNN piezoelectric film, and film forming pressure).

Figure 6:
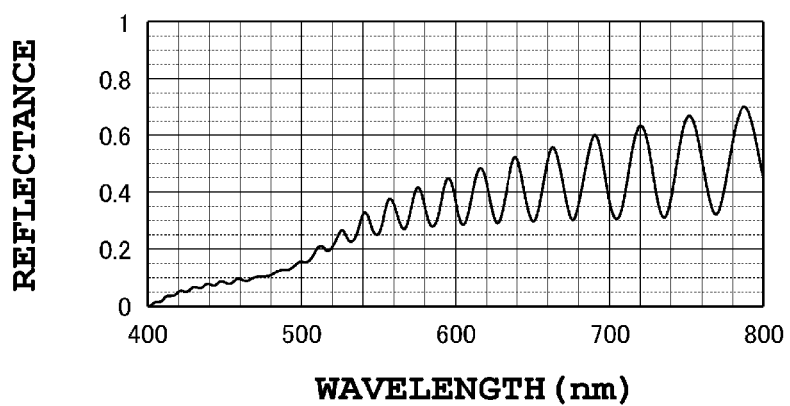
FIG. 6 is a reflection spectrum obtained when measuring a center part of a piezoelectric film of example 2 of the present invention.

Similarly to example 1, when the film thickness of the obtained piezoelectric film of example 2 was measured, the reflection spectrum as shown in FIG. 6 was obtained at the center point of the piezoelectric film. According to the reflection spectrum of FIG. 6, it was confirmed that there were at least one maximum value and one minimum value respectively, and there were nine maximum values in which the reflectance was 0.4 or more, and the largest reflectance in the maximum values was 0.70. When the film thickness at the center point was calculated, as shown in table 2, it was confirmed that the measured value of the film thickness was 2.95 μm, and a measurement error from the measured value (3.0 μm) by SEM was small. Although the reflection spectrum on the outer peripheral part of the piezoelectric film of example 2 was not shown, the reflection spectrum similar to the reflection spectrum shown in FIG. 6 was obtained. The measured value of the film thickness on the outer peripheral point by the optical system, was 2.84 μm, and it was confirmed that the measurement error from the measure value (2.9 μm) by SEM was small.

Further, in the piezoelectric film of example 2, the arithmetic average roughness Ra was 4.1 nm, and the warpage of the substrate was 35 μm.

Further, although not shown, in examples 3 and 4 as well, the reflection spectrum similar to example 1 was obtained. When the film thickness of the piezoelectric film of examples 3 and 4 was measured, as shown in table 2, it was confirmed that the measurement error was small between the measured value by SEM, and the measured value by the optical system in each piezoelectric film, and the reliability of the film thickness value was high. It was also confirmed that the surface roughness and the warpage of the substrate were small, the reflectance of the reflected light was high, and the reliability of the measurement was high.

Comparative Example 1

In comparative example 1, the piezoelectric film-attached substrate was produced similarly to example 1, excluding a point that the piezoelectric film was formed with a film thickness of 3 μm, and the surface roughness of the piezoelectric film was increased, with the pressure during film formation set to 0.01 Pa.

TABLE 3

| | | Com. Ex. 1 | Com. Ex. 2 | Com. Ex. 3 |
|---|---|---|---|---|
| Lower electrode (Pt) | Film forming temperature [° C.] | 200 | 200 | 400 |
| KNN piezoelectric film | Film forming temperature [° C.] | 500 | 650 | 500 |
| | Film forming pressure [Pa] | 0.01 | 0.3 | 0.3 |
| | Target film thickness [μm] | 3 | 3 | 3 |

Com. Ex. = Comparative Example

The whole body of the piezoelectric film of comparative example 1 was observed blackish by the naked eye, and when observing the surface by an optical microscope, a large roughness was observed. When the obtained piezoelectric film of comparative example 1 was evaluated by the optical measurement similarly to example 1, the reflection spectrum as shown in FIG. 7 was obtained at the center point of the piezoelectric film. According to the reflection spectrum of FIG. 7, it was found that the reflectance was extremely small, compared with FIG. 6 in which the film thickness measured by SEM was the same level. Further, although there were the maximum values and minimum values, it was confirmed that there was no maximum value in which the reflectance was 0.4 or more, and the largest reflectance in the maximum values was 0.07 which was extremely small at the center point. In addition, although not shown, the reflection spectrum at the outer peripheral point shows a similar waveform as the reflection spectrum shown in FIG. 7, and it was confirmed that there was no maximum value in which the reflectance was 0.4 or more, and the largest reflectance in the maximum values was 0.02 which was extremely small.

From these waveforms of the reflection spectra, calculation of the film thickness was attempted by curve fitting. However, fitting error was large by 1 digit or more, and an accurate film thickness value could not be calculated. This is because the surface of the piezoelectric film was rough, thus making it impossible to sufficiently detect the reflected light by surface scattering.

Further, when the surface roughness of the piezoelectric film was measured, the arithmetic average roughness Ra was 25 nm. Also, when the warpage of the substrate was measured similarly to example 1, it was 28 μm, and a large warpage was not recognized. Evaluation results of the comparative example 1 are shown in table 4. In table 4, "x" indicates as follows: the fitting error is large, thus making it impossible to measure the film thickness value.

TABLE 4

| | | | Com. Ex. 1 | Com. Ex. 2 | Com. Ex. 3 |
|---|---|---|---|---|---|
| Reflection spectrum | Center point | A | 0 | 4 | 0 |
| | | B | 0.07 | 0.52 | 0.31 |
| | Outer peripheral point | C | 0 | 0 | 0 |
| | | D | 0.02 | 0.32 | 0.21 |
| G [μm] | | E | x | 2.98 | 2.68 |
| | | F | 3.0 | 3.0 | 3.0 |
| H [μm] | | E | x | 2.61 | 1.99 |
| | | F | 2.9 | 2.9 | 2.7 |
| I Ra[nm] | | | 25 | 6.3 | 16 |
| J [μm] | | | 28 | 65 | 30 |

Com. Ex. = Comparative Example
A = Number of maximum values (reflectance: 0.4 or more)
B = Largest value of the reflectance in the maximum values
C = Number of maximum values (reflectance: 0.4 or more)
D = Largest value of the reflectance in the maximum values
E = Measured value in non-contact state
F = Measured value by SEM
G = Film thickness at the center point
H = Film thickness at the outer peripheral point
I = Arithmetic surface average roughness
J = Warpage of substrate Comparative Example 2

In comparative example 2, the piezoelectric film-attached substrate was produced similarly to example 1, excluding a point that the piezoelectric film was formed with a film thickness of 3 μm, and the piezoelectric film-attached substrate was produced so that the warpage of the piezoelectric film-attached substrate was large, with the film forming temperature set to 650° C.

Figure 8:
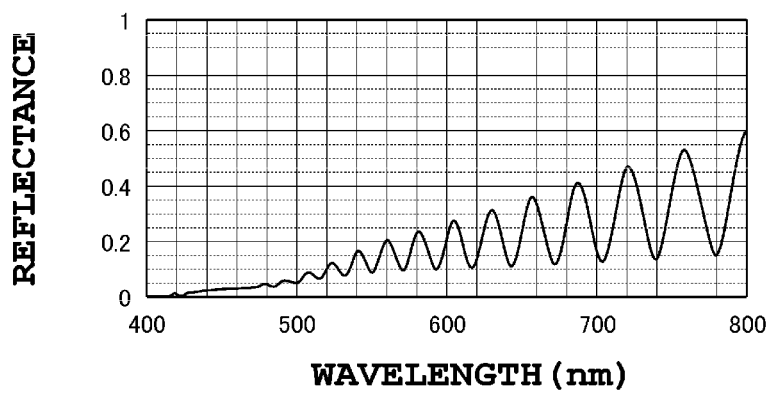
FIG. 8 is a reflection spectrum obtained when measuring a center part of a piezoelectric film of comparative example 2 of the present invention.

When the obtained piezoelectric film of comparative example 2 was evaluated by the optical measurement similarly to example 1, the reflection spectra as shown in FIG. 8 and FIG. 9 were respectively obtained at the center point and the outer peripheral point of the piezoelectric film. According to the reflection spectrum at the center point shown in FIG. 8, it was confirmed that there were one maximum value and one minimum value respectively, and there were four maximum values in which the reflectance was 0.4 or more, and the largest reflectance in the maximum values was 0.52. Meanwhile, according to the reflection spectrum at the outer peripheral point shown in FIG. 9, it was confirmed that although there were one or more maximum values and minimum values, there was no maximum value in which the reflectance was 0.4 or more, and the largest reflectance in the maximum values was 0.32. Namely, although the reflection spectrum of FIG. 9 was the same sample, when compared with the reflection spectrum of FIG. 8, the reflectance was largely decreased over the whole wavelength region. Probably this is because the reflection of the light at the outer peripheral point is different from the reflection of the light at the center point due to the warpage of the substrate, and a vertical irradiation light is not straightly reflected, and is not sufficiently detected by the light receiving part.

Further, when the warpage of the substrate was measured, the warpage amount was 65 μm. Also, when the surface roughness of the piezoelectric film was measured, the arithmetic average roughness Ra was 6.3 nm, and a large roughness was not recognized. Although the warpage of the substrate can be measured by correcting the substrate to be flat by a vacuum suction method for suction to a stage, the warpage amount is excessively large, thus possibly generating a breakage of the piezoelectric film caused by such a correction.

Comparative Example 3

In comparative example 3, the piezoelectric film-attached substrate was produced similarly to example 1, excluding a point that the piezoelectric film was formed with a film thickness of 3 μm, with the film forming temperature set to 400° C., for forming the Pt electrode layer being the lower electrode.

When the reflectance of the reflected light in the wavelength range of 400 nm to 800 nm was measured in the lower electrode (Pt electrode layer) of the piezoelectric film-attached substrate of comparative example 3, the reflection spectrum as shown in FIG. 13 was obtained. According to FIG. 13, it was confirmed that the reflectance was 0.7 or more in a wavelength range of 640 nm to 800 nm, and the reflectance was less than half in the wavelength range of 400 nm to 800 nm. Namely, the Pt electrode layer of comparative example 3 has a rough surface.

Figure 10:
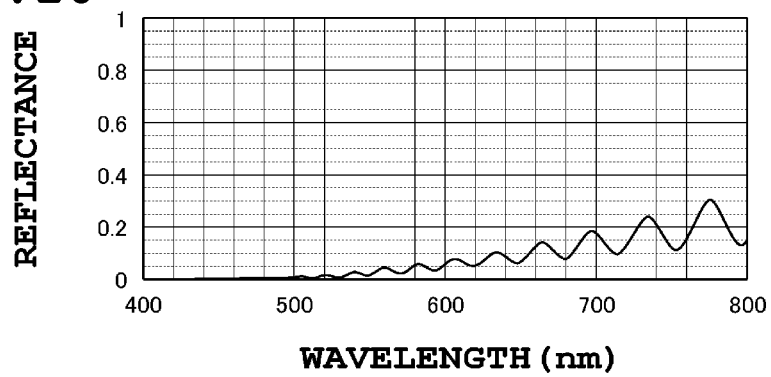
FIG. 10 is a reflection spectrum obtained when measuring a center part of a piezoelectric film of comparative example 3 of the present invention.
Figure 11:
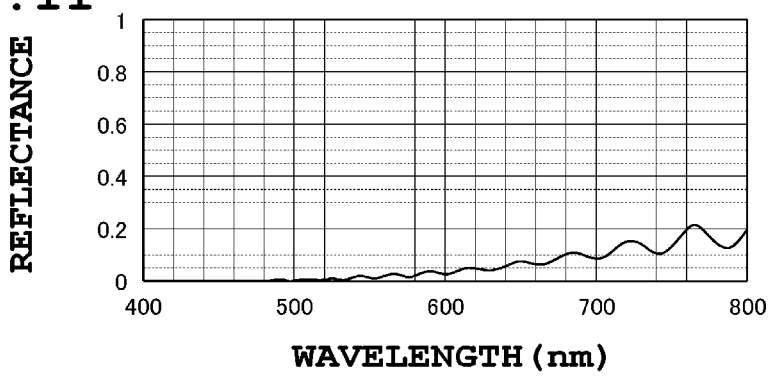
FIG. 11 is a reflection spectrum obtained when measuring an outer peripheral part of the piezoelectric film of comparative example 3 of the present invention.

It was found that the piezoelectric film of comparative example 3 was formed on the Pt electrode layer having the rough surface, and was clouded, and was not transparent or semitransparent. When the obtained piezoelectric film of comparative example 3 was evaluated by the optical measurement similarly to example 1, the reflection spectra as shown in FIG. 10 and FIG. 11 were obtained respectively at the center point and the outer peripheral point of the piezoelectric film. According to FIG. 10 and FIG. 11, it was confirmed that although there was one maximum value or one minimum value at the center point and the outer peripheral point respectively, there was no maximum value in which the reflectance was 0.4 or more, and the largest reflectance in the maximum values was 0.31 at the center point, and 0.21 at the outer peripheral point. The measured value of the film thickness obtained from the reflection spectrum was 2.68 μm at the center point, and 1.99 μm at the outer peripheral point, the measured value by SEM was 3.0 μm at the center point, and the measured value by SEM was 2.7 μm at the outer peripheral point, and a large measurement error was confirmed between the measured value obtained from the reflection spectrum and the measured value using SEM. Probably this is because in addition to the scattering of the light on the piezoelectric film, the light transmitted and entered through the piezoelectric film, was scattered on the surface of the Pt electrode layer, and the reflected light cannot be sufficiently detected. The arithmetic average roughness Ra of the piezoelectric film was 16 nm, and the warpage of the substrate was 30 μm, and a large problem was not recognized.

In the above-mentioned example, the Pt electrode layer was used for the lower electrode. However, a similar effect can be obtained even when an alloy containing Pt, Ru, Ir, or a metal oxide electrode is used. Although the Ti layer is used for the adhesive layer, a Ta layer can also be used, and even in a case of not using the adhesive layer, the similar effect can be obtained.

Preferred Aspects of the Present Invention

Preferred aspects of the present invention will be supplementarily described hereafter.

According to an aspect of the present invention, there is provided a piezoelectric film-attached substrate, including a lower electrode formed on a main surface, and a piezoelectric film having a perovskite structure formed on the lower electrode, which are sequentially laminated, wherein the piezoelectric film has a thickness of 0.3 μm or more and 10 μm or less, and a reflection spectrum shows a relation between a wavelength and reflectance calculated from a reflected light obtained by an interference of following lights: a light which is obtained in such a way that the surface of the piezoelectric film is irradiated with an irradiation light with a wavelength range of 400 nm to 800 nm and the irradiation light is reflected on the surface of the piezoelectric film, and a light which is obtained in such a way that the irradiation light is transmitted through the piezoelectric film and is reflected on the surface of the lower electrode, which is the reflection spectrum at least at one point on a center part and an outer peripheral part of the piezoelectric film, and such a reflection spectrum has at least one of the maximum value and the minimum value respectively, wherein the reflectance at least in one maximum value is 0.4 or more.

Preferably, in the lower electrode, the reflectance is 0.7 or more in a half or more region of the wavelength range of 400 nm to 800 nm, when irradiating its surface with an irradiation light with a wavelength range of 400 nm to 800 nm.

Further preferably, a surface roughness Ra of the piezoelectric film is 20 nm or less.

Further preferably, when a warpage amount is defined as a difference of heights between a center position of the piezoelectric film, and a position of a prescribed distance from the center position of the piezoelectric film, the warpage amount is 60 μm or less.

Further preferably, the piezoelectric film is made of potassium sodium niobate expressed by a general formula $(K_{1-x}Na_x)NbO_3$ (0<x<1).

Further preferably, the lower electrode has a structure including Pt, Ru, Ir, Sn, In, or is mainly composed of an oxide of them, or has a lamination structure including these electrode layers.

According to other aspect of the present invention, there is provided a piezoelectric element including the piezoelectric film-attached substrate and an upper electrode formed on the piezoelectric film.

According to further other aspect of the present invention, there is provided a method of producing a piezoelectric film element including a lower electrode; a piezoelectric film having a perovskite structure; and an upper electrode, which are formed on a main surface by sputtering, the method including:

irradiating a surface of the piezoelectric film formed on the lower electrode with an irradiation light with a wavelength range of 400 nm to 800 nm, before the upper electrode is formed;

receiving a reflected light obtained by an interference of following lights: a light which is obtained in such way that the irradiation light is reflected on the surface of the piezoelectric film, and a light which is obtained in such a way that the irradiation light is transmitted through the piezoelectric film and is reflected on the surface of the lower electrode;

obtaining a reflection spectrum showing a relation between a wavelength and a reflectance calculated from the reflected light; and judging whether the reflection spectrum obtained at least at one point on a center part and an outer peripheral part of the piezoelectric film has at least one maximum value and minimum value respectively, and the reflectance at least at one of the maximum values is 0.4 or more.

What is claimed is:

1. A method of producing a piezoelectric film element, the method comprising:

laminating sequentially a lower electrode, a piezoelectric film having a perovskite structure, and an upper electrode on a substrate by sputtering;

executing irradiation of a surface of the piezoelectric film with an irradiation light having wavelength range of 400 nm to 800 nm, the irradiation executed before the upper electrode is formed and after the piezoelectric film is formed, the piezoelectric film formed in a thickness of 0.3 μm to 10 μm;

receiving a reflected light obtained by an interference of the irradiation light reflected on the surface of the piezoelectric film and the irradiation light transmitted through the piezoelectric film on the surface of the lower electrode;

obtaining a reflection spectrum showing a relation between the wavelength of the irradiation light and a reflectance calculated from the reflected light at each part of a center part and an outer peripheral part of the substrate; and determining whether a warpage amount exceeds a defined value, the warpage amount being a difference of heights between the center part and the outer peripheral part of the substrate, wherein the reflection spectrum in one part of the center part and the outer peripheral part of the substrate has at least one maximum value and at least one minimum value, and the reflectance at least at one maximum value is 0.4 or more, and the reflection spectrum in another part of a center part and the outer peripheral part has neither the maximum value nor the minimum value, or the reflectance at all maximum values of the reflection spectrum is less than 0.4.

2. A method of producing a piezoelectric film-attached substrate, the method comprising:

laminating sequentially a lower electrode and a piezoelectric film having a perovskite structure on a substrate by sputtering;

executing irradiation of a surface of the piezoelectric film with an irradiation light having a wavelength range of 400 nm to 800 nm, the irradiation executed after the piezoelectric film is formed, the piezoelectric film formed in a thickness of 0.3 μm to 10 μm;

receiving a reflected light obtained by an interference of the irradiation light reflected on the surface of the piezoelectric film and the irradiation light transmitted through the piezoelectric film and reflected on the surface of the lower electrode;

obtaining a reflection spectrum showing a relation between the wavelength of the irradiation light and a reflectance calculated from the reflected light at each part of a center part and an outer peripheral part of the substrate; and determining whether a warpage amount exceeds a defined value, the warpage amount being a difference of heights between the center part and the outer peripheral part of the substrate, wherein the reflection spectrum in one part of the center part and the outer peripheral part of the substrate has at least one maximum value and one minimum value, and the reflectance at least at one maximum value is 0.4 or more, and the reflection spectrum in another part of the center part and the outer peripheral part of the substrate has neither the maximum value nor the minimum value, or the reflectance at all maximum values of the reflection spectrum is less than 0.4.

3. The method of producing a piezoelectric film-attached substrate according to claim 2, wherein the defined value is 60 μm.

4. The method of producing a piezoelectric film-attached substrate according to claim 2, wherein it is determined that a surface roughness Ra of the piezoelectric film exceeds a defined value when the reflection spectrum has neither a maximum value nor a minimum value respectively at both of the center part and the outer peripheral part of the substrate, or the reflectance at all maximum values of the reflection spectrum is less than 0.4.

5. The method of producing a piezoelectric film-attached substrate according to claim 4, wherein the defined value is 20 nm.

6. The method of producing a piezoelectric film-attached substrate according to claim 2, comprising:

executing irradiation of the surface of the lower electrode with an irradiation light having a wavelength range of 400 nm to 800 nm, the irradiation executed before the piezoelectric film is formed and after the lower electrode is formed;

receiving a reflected light reflected on the surface of the lower electrode; and determining that a reflectance calculated from the reflected light is 0.7 or more in a half or more region of the wavelength range of 400 nm to 800 nm.

7. The method of producing a piezoelectric film-attached substrate according to claim 2, wherein the piezoelectric film comprises potassium sodium niobate expressed by a general formula $(K_{1-x}Na_x)NbO_3$ (0<x<1).

8. The method of producing a piezoelectric film-attached substrate according to claim 2, wherein the lower electrode is formed by:

a) an electrode layer composed of Pt, Ru, Ir, Sn, In, or oxides thereof, or b) an electrode layer of a lamination structure including electrode layers of a).

9. The method of producing a piezoelectric film-attached substrate according to claim 2, wherein the center part of the substrate indicates an area inside of r/3 and the outer peripheral part of the substrate indicates an area outside of 2r/3 on the substrate having a radius r.

* * * * *